(12) United States Patent  (10) Patent No.: US 8,429,591 B2
Kwan et al.  (45) Date of Patent: Apr. 23, 2013

(54) METHODS AND APPARATUS FOR SINGLE TESTING STIMULUS

(75) Inventors: Gary Yu-Kwun Kwan, Santa Cruz, CA (US); Jimmy Soon Yoong Yeap, Island Glades (MY)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/042,194

(22) Filed: Mar. 7, 2011

(65) Prior Publication Data

US 2012/0060140 A1    Mar. 8, 2012

(30) Foreign Application Priority Data

Mar. 12, 2010  (MY) .......................... PI 2010001094

(51) Int. Cl.
*G06F 17/50*  (2006.01)

(52) U.S. Cl.
USPC .............. 716/136; 716/106; 714/33; 714/725

(58) Field of Classification Search .................. 716/106, 716/136; 714/33, 725
See application file for complete search history.

(56) References Cited

U.S. PATENT DOCUMENTS

| | | | | |
|---|---|---|---|---|
| 7,440,885 | B2* | 10/2008 | Garcia et al. | 703/25 |
| 7,480,609 | B1* | 1/2009 | Cavanagh et al. | 703/23 |
| 2002/0184602 | A1* | 12/2002 | Yokoyama et al. | 716/1 |
| 2009/0100304 | A1* | 4/2009 | Li et al. | 714/725 |
| 2009/0150136 | A1* | 6/2009 | Yang | 703/13 |
| 2010/0146338 | A1* | 6/2010 | Schalick et al. | 714/33 |

* cited by examiner

*Primary Examiner* — Naum Levin
(74) *Attorney, Agent, or Firm* — Mauriel Kapouytian & Treffert LLP; Thomas Treffert; Michael Mauriel

(57) ABSTRACT

Methods and apparatus useful for improving the performance of testing and diagnostic operations on user circuit designs potentially across multiple phases of the development lifecycle and across multiple implementation technologies are described. As one example, a single testing and diagnostic stimulus source can variously provide test pattern data to different potential instantiations of the user circuit design by supporting and selectively utilizing a number of DUT-facing communication channels.

18 Claims, 3 Drawing Sheets

METHODS AND APPARATUS FOR SINGLE TESTING STIMULUS

BACKGROUND

Modern circuit designs are exceedingly complex and rely on electronic design automation (EDA) technology for their development. While often intended for implementation as an integrated circuit device, a user circuit design may be implemented during development with computer hardware and software. Such a computer hardware and software implementation may advantageously implement the user circuit design by simulating the circuit operation of a potential integrated circuit device. Simulation of the circuit design allows early testing, and identification and correction of problems, and maximizes the opportunity to leverage computing power to address today's most complex circuit engineering challenges. After successful simulation a circuit design may then be more productively implemented in the hardware circuitry of an integrated circuit device. Programmable logic devices (PLDs) are an ideal solution for fast hardware implementation, offering the engineer the opportunity to move from testing a simulation model of a circuit design to an IC (hardware) model of a circuit design all within hours and within the space of his or her own desktop. Regardless, however, of whether a PLD is employed for a hardware implementation of the circuit design, and regardless of the sophistication of EDA tools and systems, the increasing size, scope, and complexity of the circuitry implemented on a single IC hardware device has placed an increasing burden and importance on the ability to test and diagnose a circuit design implementation.

SUMMARY

Methods and apparatus are disclosed related to improving circuit design testing and diagnosis. In one aspect, a diagnostics console is able to direct test data communications selectively among multiple paths depending on the present instantiation of the user circuit design. In another aspect, computer software for such a diagnostics console and environment is recorded in computer-readable form on digital storage media for execution by electronic data processing apparatus. In yet another aspect, system console software is combined with electronic data processing apparatus as a testing and diagnostics system. These and other aspects will become apparent to one of skill in the art by considering the drawings and the description that follows.

DETAILED DESCRIPTION

Methods and apparatus are described below for improving the reliability and effectiveness of circuit design testing and diagnosis. In one aspect, a bimodal (or other multimodal) diagnostic communication circuit block (DCCB) is included in a user circuit design. The DCCB provides a common set of circuitry for conveying diagnostic data and control information between external connections and internal circuitry of the IC device under test. While the DCCB presents a stable circuitry contingent across simulation and hardware (single IC) implementations to aid eliminating the kinds of errors that arise when different testing interface circuits are used for different implementations, the DCCB interfaces to the external connections in a generic format that is adaptable to the differing diagnostic data communication channels that may be utilized in different testing modes, such as simulation testing or hardware testing. A system console component of the diagnostics host takes user input data, such as commands and test data patterns, and directs them to the DCCB of an operational implementation of the user circuit design, i.e., the device under test (DUT). The system console component performs processing to make a determination about the DUT mode (for example, whether the DUT is a simulation or IC implementation) and, based on that determination, selectively directs communication to the DCCB via a communication channel compatible with the mode.

Figure 1:
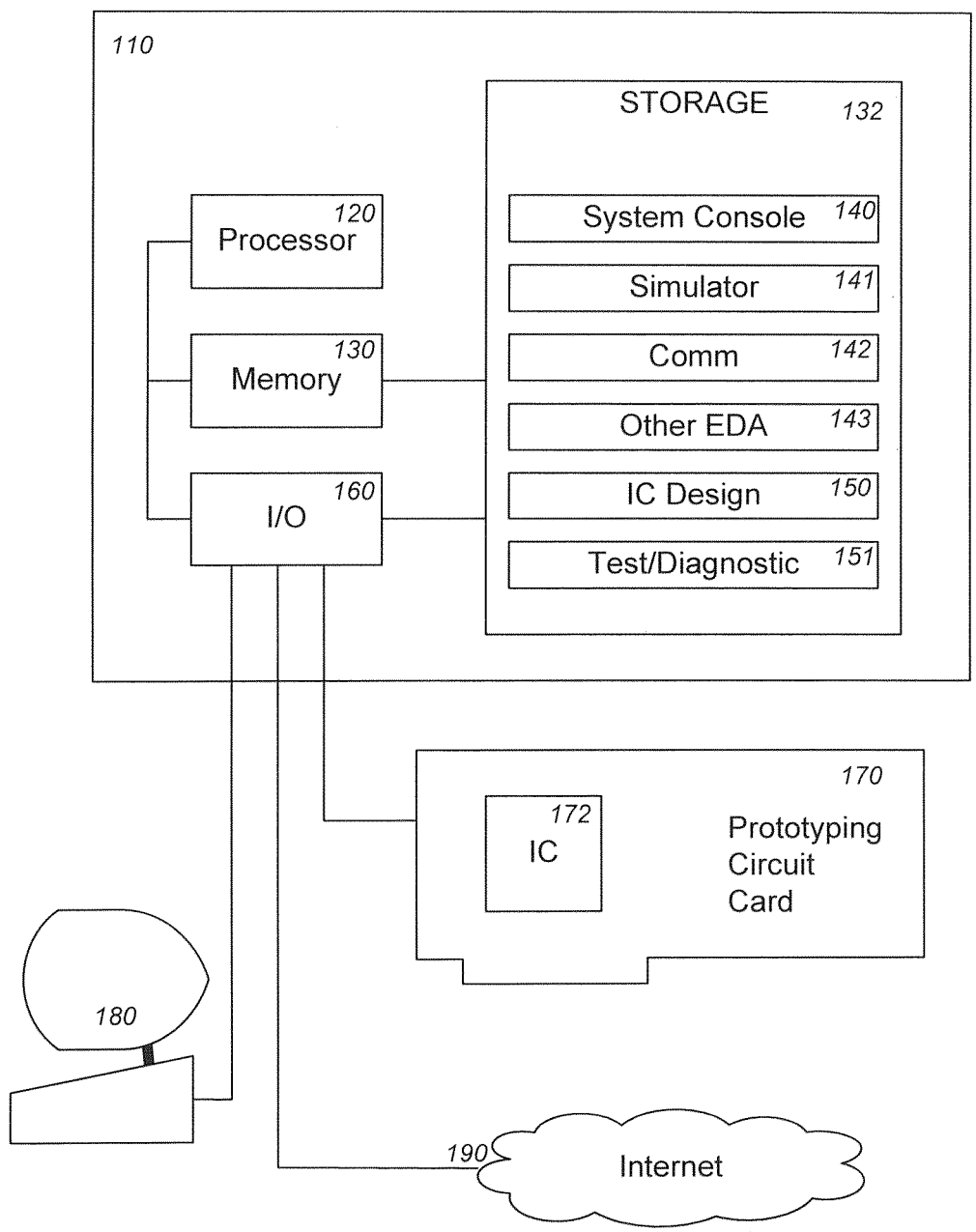
FIG. 1 is a block diagram for a system useful in the practice of subject matter disclosed herein.

FIG. 1 is a block diagram for a system useful in the practice of subject matter disclosed herein. System 100 includes computer 110, prototyping circuit card 170, user interface apparatus 180, and network connection 190. Computer 110 is a data processing apparatus adapted to perform EDA functions including, for example, circuit diagnostic testing. Computer 110 includes processor circuitry 120, memory 130, I/O circuitry 160, coupled together by bus 122. Processor circuitry 120 includes circuitry to effect EDA data processing functions. Processor circuitry 120 in some embodiments may include one or more microprocessor cores in one or more IC packages. In yet other embodiments, processor circuitry 120 includes one or more PLD devices configured to effect EDA data processing functions. PLD devices may include, for example, gate arrays, CPLDs, FPGAs, or mask-program structured logic devices. Other embodiments for processor circuitry 120, of course, are possible. Memory 130 in combination with persistent storage device 132 illustrate an embodiment of local data and instruction storage. (One of skill in the art understands that the storage of computer 110 may use or include network-based (remote) storage apparatus and facilities such as may be accessed by network connection 190, for example.) In an embodiment of computer 110, memory 130 is high-speed RAM storage attached to bus 122. Other embodiments may variously include EEPROM, ROM, PROM, or flash memory devices, for example. Storage 132 includes one or more persistent storage devices and media controlled by I/O circuitry 160. Storage 132 may include magnetic, optical, magneto optical, or solid-state apparatus for digital data storage, for example, having fixed or removable media. Sample devices include hard disk drives, optical disk drives, floppy disks drives, and flash keyfobs. Sample media include hard disk platters, CD-ROMs, DVD-ROMs, BD-ROMs, floppy disks, and the like.

Storage 132 of computer embodiment 110 includes software portions 140-143 and data portions 150-151. System console 140 includes program instructions for processing user input related to testing and diagnostics and to interact with an implemented DUT. In one embodiment, system console 140 further includes program instructions to implement a DUT instance by either starting a simulation of a user design or by configuring a PLD for it. Simulator 141 includes program instructions to implement a user circuit design by simulation using the data processing capabilities of computer 110. Communication software 142 includes program instructions for effecting data communications via one or more methods or protocols. Other EDA software 143 includes program instructions for performing other EDA functions on computer 110. IC design data 150 includes information representing a user circuit design. Test/diagnostic data 151 includes information useful in conducting diagnostic testing on an implemented user design. Test/diagnostic data 151 may include, for example, test data patterns used to establish signaling or operating states or conditions for a DUT. Test/diagnostic data 151 may include in some embodiments, for example, programming or scripting statements related to conducting a diagnostic testing procedure or process. One of skill in the art understands that while stored software 140-143 and data 150-151 are shown in persistent storage 132 (whether each is stored as one or more directories, files, modules, components, or segments), such software and data, in whole or in part, could be stored in memory 130 as an alternative to, or in addition to, its storage at 132.

Prototyping circuit card 170 includes integrated circuit 172. In one embodiment integrated circuit 172 is a PLD. In another embodiment, integrated circuit 172 is particularly an FPGA such as one of the many models of Stratix®, Cyclone®, or Arria® FPGA chips available from Altera Corporation, San Jose, Calif. In the same embodiment, prototyping circuit card 170 also includes circuitry to receive configuration information for IC 172 from computer 110, to initiate the configuration, reconfiguration, or reset of IC 172 in response to computer 110, and to communicate test data between IC 172 and a connection to computer 110.

User interface apparatus 180 includes one or more devices to facilitate user interaction with computer 110. Samples of user interface input devices include keyboards, keypads, mice, touch sensitive surfaces, and digitizing tablets. Samples of user interface output devices include graphical display screens, text panels, and printers. Network connection 190 includes circuitry to communicate with one or more computers or computer-based devices. Network connection 190 may include Internet connectivity.

One of skill in the art will appreciate that system 100 is merely illustrative of the many types and configurations of data processing apparatus that may be used to practice the novel subject matter disclosed herein. Many functions depicted locally for system 100 such as persistent storage 132 and user interface 180, may easily be practiced remotely in this or other embodiments by utilizing a network connection such as 190. The many functions implied for computer 110, such as system console and simulator functions, might be distributed across multiple computers in this or other embodiments. Accordingly, system 100 is not intended to imply restrictions or limitations on the use of novel subject matter, but is rather intended to provide a useful example from which further explanation can proceed.

Figure 2:
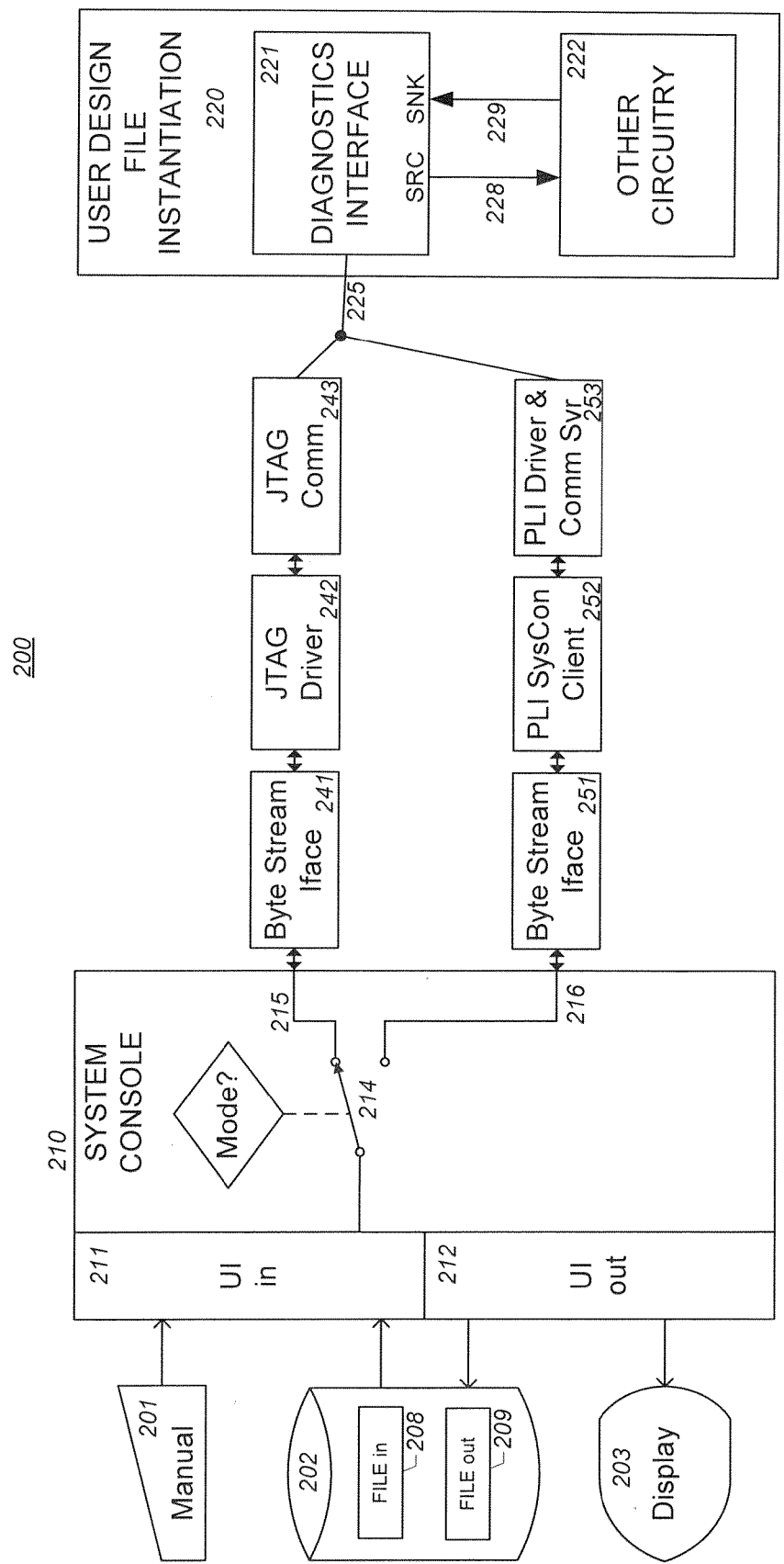
FIG. 2 is a block diagram showing one embodiment with unified diagnostic stimulus for circuitry of a device under test (DUT).

FIG. 2 is a block diagram showing one embodiment with unified diagnostic stimulus for circuitry of a device under test (DUT). Diagnostics system configuration 200 includes system console 210 for conducting user directed diagnostic exchanges with an instantiation of a user circuit design 220. A first communication channel between the system console and the user design instance includes byte stream interface 241, JTAG driver 242, and JTAG communications 243. A second communication channel between the system console and the user design instance includes byte stream interface 251, PLI system console client 252, and PLI driver and communications server 253. The system console 210 responds in part to instructions, commands, and test data patterns, for example, provided at user input 211. User input component 211 may accept and process input from a variety of sources. For example, input may be supplied from a manual input device 201 such as a keyboard or mouse. Input may also be supplied, for example, from a stored file 208. The stored file 208 may include, for example, data mimicking manual user input, test scripts, test data patterns, and such, alone or in combination. The system console 210 further includes user output component 212 to report or record processing results. For example, processing results may be presented to a user by means of a visual display 203. Processing results may also be recorded for a user, for example, to an output file 209.

The computer system such as system 100 of FIG. 1 can be readily understood for use in implementing diagnostics system configuration 200 of FIG. 2. For example, system console software 140 of FIG. 1 executing on computer 110 can be understood to correspond to system console 210 of FIG. 2. Similarly, test/diagnostic data 151 of FIG. 1 can be understood to correspond to data 202 of FIG. 2, and manual input 201 and display output 203 of FIG. 2 can be understood to correspond to I/O apparatus 180 of FIG. 1.

During the operation of system console 210 of FIG. 2 in one embodiment, input information is processed indicating one or more data values to be communicated with diagnostic components of user design instance 220. The one or more data values may be referred to as a test data pattern. At some point in time before the test data pattern is communicated to the user design instance 220, system console 210 exercises processing component 213 to make a determination of the mode of the current implementation under test, i.e., whether the present user circuit design instance 220 is an IC hardware instance or a simulation instance, in the illustrated embodiment. Such a determination may be made, for example, by checking a stored data value that indicates the current mode. Such a determination may also be made, for example, by recognizing user input indicating a current mode. One of skill in the art recognizes that there are many possible ways to make such a determination within the ordinary skill of a practitioner. Determination of the current mode is used by system console 210 to selectively direct the test data pattern to a communication channel appropriate for the current mode. Such selective direction is indicated by switch 214 of FIG. 2.

Regardless of the selected channel, the test data pattern emerges to user circuitry under test 222 from a diagnostics interface block (DCCB) 221, the definition of which in the user circuit design specification need not change from mode to mode. Consistency in the circuit definition between simulation and hardware modes results in simulations that more accurately model IC hardware operation. Further, a system console and associated UI, test scripts, and data can be consistently used for design testing across modes, further contributing to efficiency, effectiveness, reliability, and productivity. In one embodiment, diagnostics data is conveyed between DCCB 221 and user circuitry under test 222 via source signals 228, sink signals 229, and any related clock and control signals (not shown separately). In one embodiment, the DCCB is a circuit design module that includes the following signal connections: clock, reset, source_data, source_valid, sink_data, sink_valid, sink_ready, and reset_request. The DCCB of a simulation mode instance has the signals bound with a PLI communication channel, that is, a communication channel implemented with executing C library routines taking advantage of Verilog's programming language interface (PLI) capability (and, so, compliant with PLI defined requirements to achieve interoperability). The DCCB of an IC hardware mode instance has the signals bound with a JTAG communication channel.

The IC hardware mode channel (e.g., JTAG) of the sample embodiment includes byte stream interface 241, JTAG driver 242, and JTAG communications 243. Byte stream interface 241 adapts between a standard system console view of a communication channel and a JTAG Driver component 242. Both the byte stream interface 241 and JTAG driver 242 components are operationally implemented as executing software on the computer system hosting system console 210. These communication channel components may or may not be considered components of system console, itself. Moreover, one of skill in the art understands that each such communication channel component depicted in FIG. 2 may be constructed from a number of subcomponents that may relate to one another in a layered or stacked fashion. For example, in one embodiment, byte stream interface 241 includes a first layer component for complying with a system console byte stream service API and a second layer component for complying with the requirements of the DCCB at the far end of the communication channel. Further in this embodiment, JTAG driver 242 includes a first layer component to implement JTAG client functions, a second layer component to implement JTAG server functions, and a third layer component to implement a hardware communications device driver such as for the USB-Blaster™ available from Altera Corporation. In this embodiment, JTAG driver 242 may be easily implemented using the features of the Quartus® EDA software, also available from Altera Corporation.

JTAG communication block 243 moves data in the channel between driver 242 and the DCCB 221 of the user design instance 220. In one embodiment, JTAG communication component 243 includes a number of subcomponents as follows. USB-Blaster hardware (in response to driver 242) toggles JTAG signaling lines connected to JTAG pins on the integrated circuit implementing the user design under test—in this embodiment, an Altera FPGA device. The toggling of the signal lines, in terms of timing, electrical aspects, etc., is compliant with JTAG communications requirements, as are other aspects of the communications channel (e.g., protocol software, etc.). A hard logic state machine in the FPGA responds to the toggled signal lines, forwarding recovered JTAG data to a system level debug hub component. The system level debug hub component directs appropriate data to a system level debug node component associated with the DCCB. Further components deserialize the data, remove idle characters according to protocol, and perform clock crossing functions to convert between the JTAG channel and DCCB clock domains, before presenting the test data pattern information to DCCB 221. In one embodiment, the system level debug hub and later components are implemented by configuring programmable logic of the FPGA device.

The simulation mode channel of the sample embodiment includes byte stream interface 251, PLI system console client 252, and PLI driver and communications server 253, each implemented as software executing on the computer system that hosts system console 210, in this sample embodiment. Byte stream interface 251 adapts between a standard system console view of a communication channel and a PLI-facing system console client component 252. In one embodiment, system console client 252 includes a Java component simulating a JTAG interface and communicating with PLI driver and communications server 253 via local (internal) TCP/IP traffic. PLI driver and communications server 253 is implemented here as a library of C language routines that are loaded by the simulator of the user circuit design instance. In one embodiment, ModelSim® software available from Mentor Graphics Corporation of Wilsonville, Oreg. is executed to implement simulation instances of user circuit designs and to provide the operating platform for PLI driver and communications server 253. (The ModelSim software may also be available as part of an integrated distribution of the Altera Quartus software mentioned previously.) In addition to receiving test data pattern communications over TCP/IP from PLI system console client 252, PLI driver and communications server 253 operates to communicate test data pattern information to the simulation instance of DCCB 221, using the simulation processing accessed through the PLI API of the simulator.

One of skill will appreciate that, although, for simplicity, the discussion of the operation of diagnostics configuration 200 described the communication of diagnostic data unidirectionally (from system console 210 to a user design instance 220), diagnostics communication in system 200 is bidirectional, with communication in a second direction being readily understood from the discussion of communication in the first direction.

Figure 3:
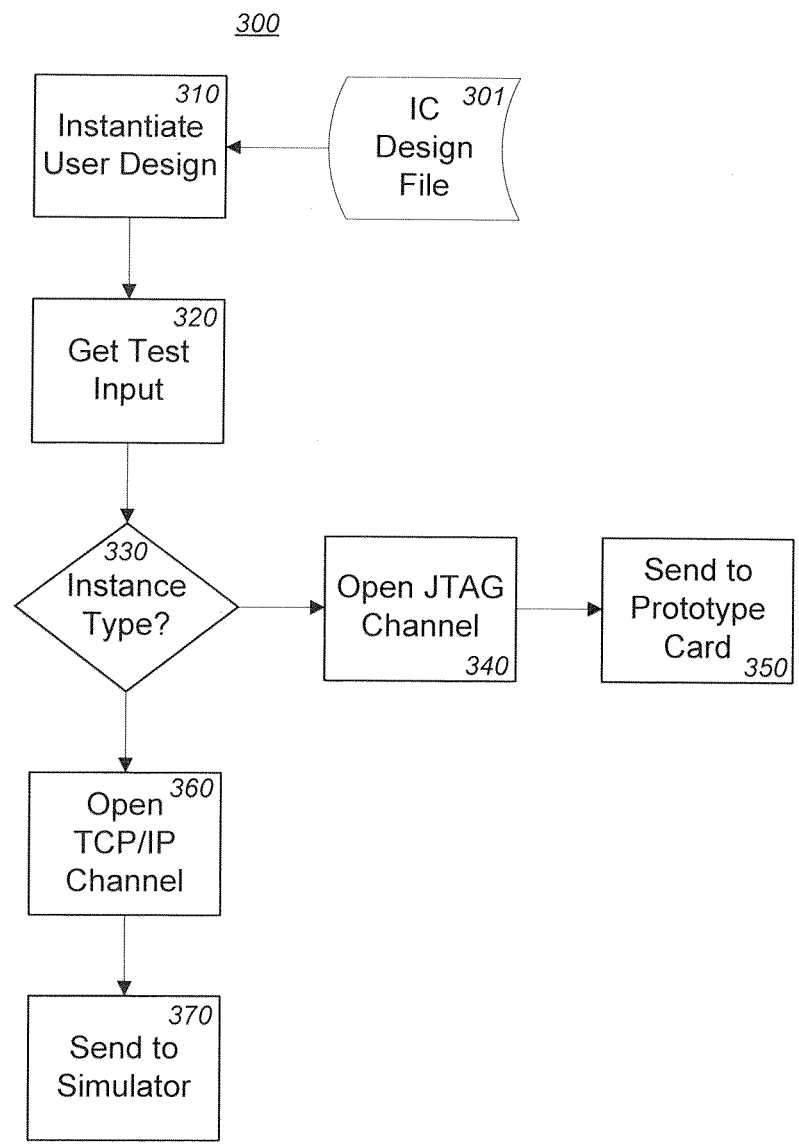
FIG. 3 is a flowchart for diagnostic processing in one unified stimulus embodiment.

FIG. 3 is a flowchart for diagnostic processing in one unified stimulus embodiment. The testing and diagnostics system 200 of FIG. 2 provided for a unified source of testing stimulus (e.g., test data patterns) across a number of possible implementation technologies for a user circuit design (e.g., simulation and IC hardware). In system 200, system console 210, and possibly a test information input source such as file 208, served as the unified source of testing stimulus. FIG. 3 now illustrates one embodiment of processing that may be conducted to effect a unified stimulus source. The processing depicted in FIG. 3 illustrates a portion of processing that may be conducted, for example, by a system console such as 210 of FIG. 2.

At block 310 of FIG. 3 a user design is instantiated. For example, a file 301 containing a representation of a user circuit design may be read at block 310 and loaded into a compatible PLD IC device. As another example, a file 301 containing the same representation of the user circuit design (or a related representation, such as from a different stage of EDA lifecycle processing) may be read at block 310 for simulation by the data processing system. At block 320, input information is retrieved regarding a testing or diagnostic operation and may include a test data pattern to be applied to the user circuit design instance. For example, manual keyboard or mouse input, or data from a file, may be retrieved as test input. At block 330, a determination is made as to the type or mode of the user circuit design instance of block 310 now being targeted for testing. In this sample embodiment, the result of the determination processing of block 330 will indicate whether the current DUT instance is implemented using simulation or IC hardware. In other embodiments, other instance types and a greater number of instance types are possible. Block 330 then follows its determination processing with selection processing, i.e., selecting a communication channel for use with the DUT instance, based on consideration of the result from the preceding determination. If the determination processing indicated the current DUT instance is implemented using IC hardware, a communication channel that includes JTAG portions is selected. The selected channel is opened at block 340 and test pattern data is sent to the hardware IC instance using the channel. If the determination processing indicated the current DUT instance is implemented using simulation apparatus, a communication channel that includes TCP/IP portions is selected. The selected channel is opened at block 360 and test pattern data is sent to the simulation IC instance using the channel. In one embodiment, the communications channel selected for use with a simulation IC instance includes a PLI portion to facilitate applying test pattern data to the simulation IC instance.

One of skill in the art will appreciate that an IC design testing and diagnostic apparatus that includes a processing portion similar to that shown in FIG. 3 offers many possible benefits for improved testing and diagnostic operations including, for example, the possibility of a common user interface across test implementations and the improved reliability and productivity that may be associated with using common test data pattern sources across test implementations.

One of skill in the art further appreciate that the details used to describe the sample embodiments depicted in the figures were included to help foster an understanding of more general inventive subject matter. Many options and alternatives beyond those already discussed are within the grasp of the ordinary practitioner setting out to practice inventive subject matter disclosed herein and, accordingly, embodiments that includes such options and alternatives are considered within the scope of the inventive subject matter. Accordingly, the details discussed illustratively and instructively above should not be considered to restrict or limit the inventive subject matter, the scope of which may more properly be understood by consideration of the claims that follow.

What is claimed is:

1. A method for testing an integrated circuit design, comprising:
   using a computer and thereby:
   accessing a test script for an IC device wherein said test script indicates a data pattern;
   determining whether a testing operation for the IC device targets a hardware implementation or a computer simulation;
   selectively sending said data pattern using a first communication channel or a second communication channel based on said determining.

2. The method of claim 1 wherein said hardware implementation includes a programmable logic device.

3. The method of claim 2 wherein said programmable logic device is a field programmable gate array.

4. The method of claim 3 wherein said first communication channel includes a JTAG compliant portion.

5. The method of claim 4 wherein said second communication channel includes a PLI compliant portion.

6. The method of claim 1 wherein said first communication channel includes a JTAG compliant portion.

7. The method of claim 1 wherein said second communication channel includes a PLI compliant portion.

8. A system for testing an integrated circuit under development, comprising:
   a CPU;
   a communication circuit coupled to said CPU and couplable to an IC device under test; and
   digital data storage, including:
   first program code, which when executed by the CPU, interfaces with a source of user input, whereby information about a data pattern for testing an IC design is accessed and wherein said IC design includes a diagnostics communications block;
   second program code, which when executed by the CPU, interfaces with a first communication channel for communicating with said diagnostics communications block during simulation of said IC design;
   third program code, which when executed by the CPU, interfaces with a second communication channel for communicating with said diagnostics communication block during hardware implementation of said IC design; and
   fourth program code, which when executed by the CPU, sends said data pattern using one of said second program code or said third program code based on a determination of whether a computer simulation or a hardware implementation of said IC design is targeted.

9. The system of claim 8 wherein said second communication channel includes said communication circuit.

10. The system of claim 9 wherein said hardware implementation of said IC design includes a programmable logic device.

11. The system of claim 10 wherein said programmable logic device is a field programmable gate array.

12. The system of claim 11 wherein said second communication channel is adapted to a JTAG interface.

13. The system of claim 12 wherein said first communication channel is adapted to a PLI interface.

14. A non-transitory computer readable medium for IC design development diagnostics, comprising:
   first interface computer code, which when executed by a computer, interfaces with a first communication channel for communicating with a diagnostics communication block of an IC design under test;
   second interface computer code, which when executed by a computer, interfaces with a second communication channel for communicating with said diagnostics communication block; and
   diagnostic console computer code, which when executed by a computer, accesses a test data pattern and selectively sending said test data pattern by said first interface computer code or said second interface computer code based on a determination of whether said IC design is under test as a simulation device or as a hardware instance.

15. The non-transitory computer readable medium of claim 14 wherein said diagnostic console computer code comprises code for accepting a scripting language file as input.

16. The non-transitory computer readable medium of claim 15 wherein said hardware instance comprises a integrated circuit having a programmable logic circuit.

17. The non-transitory computer readable medium of claim 16 wherein said programmable logic circuit comprises a field programmable gate array circuit.

18. The non-transitory computer readable medium of claim 17 wherein said field programmable gate array circuit is configured to effect said diagnostics communication block and with circuitry communicating therewith for JTAG data transfer.

* * * * *